United States Patent [19]
Ishino et al.

[11] Patent Number: 6,137,185
[45] Date of Patent: Oct. 24, 2000

[54] ELECTRODE STRUCTURE OF A WIRING SUBSTRATE OF SEMICONDUCTOR DEVICE HAVING EXPANDED PITCH

[75] Inventors: Masakazu Ishino; Ryohei Satoh, both of Yokohama; Mamoru Mita, Hitachi, all of Japan

[73] Assignee: Hitachi, Ltd., Tokyo, Japan

[21] Appl. No.: 09/264,813

[22] Filed: Mar. 9, 1999

Related U.S. Application Data

[62] Division of application No. 08/781,860, Jan. 10, 1997, Pat. No. 5,886,409.

[30] Foreign Application Priority Data

Jan. 16, 1996 [JP] Japan ................................ 8-004436

[51] Int. Cl.$^7$ .......................... H01L 23/48; H01L 23/52; H01L 29/40
[52] U.S. Cl. .......................... 257/786; 257/693; 257/737; 257/738; 257/778; 257/783; 257/779; 257/735
[58] Field of Search .................................. 257/786, 693, 257/737, 738, 784, 700, 690, 778, 783, 779, 735

[56] References Cited

U.S. PATENT DOCUMENTS

| | | | |
|---|---|---|---|
| 5,216,278 | 6/1993 | Lin et al. | 257/688 |
| 5,382,827 | 1/1995 | Wang et al. | 257/686 |
| 5,433,822 | 7/1995 | Mimura et al. | 257/693 |
| 5,523,622 | 6/1996 | Harada et al. | 257/734 |
| 5,581,122 | 12/1996 | Chao et al. | 257/691 |
| 5,583,377 | 12/1996 | Higgins, III | 257/707 |
| 5,598,036 | 1/1997 | Ho | 257/738 |
| 5,640,048 | 6/1997 | Seina | 257/738 |

FOREIGN PATENT DOCUMENTS

| | | | |
|---|---|---|---|
| 63-175450 | 7/1988 | Japan | 257/693 |
| 1-313969 | 12/1989 | Japan | 257/693 |
| 3-116838 | 9/1991 | Japan | 257/693 |

OTHER PUBLICATIONS

"Simple–Structure", Generally Applicable Chip–Scale Package, IEEE, 1995, pp. 218–223.

*Primary Examiner*—Mahshid Saadat
*Assistant Examiner*—Jhihan B. Clark
*Attorney, Agent, or Firm*—Beall Law Offices

[57] ABSTRACT

An electrode structure as well as the fabrication method thereof is disclosed which may enable successful pad layout conversion of interconnection electrode pads on the periphery of an associated IC chip to a grid array of rows and columns of terminal solder pads arranged occupying the entire area of the opposite surface of the chip while permitting use of a minimized length of wire leads for interconnection therebetween. This is achieved by (i) preparing a flat square IC chip which has an array of regularly spaced peripheral bonding pads the number of which along each of four chip sides is equally defined by a function of 2i(2i−1) where "i" is an integer and which also has external connection pads made of aluminum, (ii) sequentially forming nickel and gold coat films on the chip by electroless plating techniques, (iii) electrically coupling by metal contacts using thermal compression-bonding techniques the peripheral bonding pads to the pad layout conversion substrate for rearrangement of the peripheral bonding pads into the grid array of solder pads, and (iv) filling an adhesion resin between the conversion substrate and the IC chip.

16 Claims, 6 Drawing Sheets

ELECTRODE STRUCTURE OF A WIRING SUBSTRATE OF SEMICONDUCTOR DEVICE HAVING EXPANDED PITCH

This is a divisional application of U.S. Ser. No. 08/781,860, filed Jan. 10, 1997 now U.S. Pat. No. 5,886,409.

BACKGROUND OF THE INVENTION

The present invention relates to an electrode structure of an integrated circuit and method for forming the package therefor. The invention also relates to electronic circuitry mounting schemes for forming circuit networks by mounting a semiconductor IC chip on a carrier substrate and providing electrical interconnections therefor, and more particularly to the electrode structure of semiconductor ICs and its packaging formation method adaptable for use in attaining a low cost mount with increased integration density.

Conventionally, most semiconductor devices having an IC chip employ chip-mount methodology which makes use of wire-bonding or tape-automated bonding technology for electrical interconnections of carrier substrates known as "lead frames."

These carrier substrates are is typically molded using certain plastic material after completion of the necessary electrical connections. Overhang portions of leads are wire-bonded by soldering to several or all of the solder pads provided on an associated circuit board.

In the recent years, as a further reduction in size or "down-sizing" is more strictly demanded for electronic modules, it is becoming important more and more to decrease or "miniaturize" the mount area that semiconductor IC packages occupy on the circuit board.

One currently available approach to attain this is to develop a bare-chip mount scheme and chip-size packaging. On the other hand, where an increased number of bonding pads are provided on a chip of limited surface area, what is called the "flip-chip(FC)" interconnection scheme may be desirable.

This scheme is to employ an area-electrode structure which has a grid array of bonding pads spanning substantially the entire surface of an IC chip, for achievement of electrical interconnections by use of solder bumps. This may offer the capability of allowing the pads to increase in distance between adjacent ones thereof and the ability to minimize the inductance at pad connections.

Unfortunately, prior known semiconductor IC devices with the above packaging schemes do not come without an accompanying problem: forming of FC connections serves to increase the risk of occurrence of a failure due to unwanted electrical short-circuiting between adjacent solder bumps during solder-reflow process. This is due to the fact that since most IC chips are inherently designed under an assumption that their bonding pads assume use of wire bonding techniques, layout of such pads must be "crowded" on the periphery of an IC chip causing the pad distance or pitch to decrease accordingly. Providing FC connections for such short-distance spanning bonding pads results in an increase in possibility of shortcircuiting to occur between adjacent pads.

Another problem encountered with the prior art is that where the TAB or FC schemes are employed for electrical interconnection of an IC chip, a special metalization process should be required to enhance or maximize the reliability of bonding pads concerned. This in turn leads to a decrease in commercial availability of such special type of IC chips as well as an increase in production costs.

In most cases the IC chip's bonding pads for external connection are made of aluminum, which remains relatively inferior in solderability; even when wetness is attained to some extent, aluminum tends to rapidly diffuse into a soldering material causing applicability for soldering to decrease. To ease or avoid such difficulty, the bonding pads for FC connection are typically comprised of a multi-layered structure such as a hybrid of chromium (Cr), copper (Cu) and gold (Au) films being sequentially laminated on an aluminum base electrode.

In view of the foregoing, it is rather difficult to obtain IC chips having FC electrode pads adaptable for use in high-density mount packaging. Even where such IC chips are available, a limitation in type must exist while prices are high, lowering applicability. This is a further problem faced with the prior art semiconductor IC packaging.

One possible approach to avoid the above problems is the use of ball grid array (BGA) packages, one of which has been described in, for example, U.S. Pat. No. 5,216,278 issued Jun. 1, 1993 to Lin et al. and assigned to Motorola, Inc. With the BGA package disclosed, an IC chip having bonding pads is mounted to a carrier substrate while letting the pads be wire-bonded for electrical interconnection to bonding areas in package leads on the substrate. These bonding areas in turn are connected by conductive through-holes called the "filled vias" to a grid array of terminal solder pads on the bottom surface of the carrier substrate. The solder pads act as FC connection electrodes which permits connection of the IC chip with external circuitry outside of the substrate. With such BGA packaging scheme, the IC chip with wire-bonding pads is capable of being electrically coupled at the FC pads to any desired external circuits.

Unfortunately, this prior art suffers from a problem in that the carrier substrate for pad layout conversion becomes larger in size than an IC chip being mounted thereto. This is true because the IC chip is electrically coupled to FC pads by use of wire leads. More specifically, wires are employed as electrical connections for the IC pads, which wires extend outwardly from the pads to be bonded with corresponding soldering areas of package leads on the top surface of the carrier substrate, which in turn are coupled to the FC pads on the substrate bottom surface by way of conductive via holes—say, "vias"—that are formed in the substrate at locations outside the soldering areas.

Another disadvantage of the prior art is that the BGA packaging as taught by U.S. Pat. No. 5,216,278 will be difficult to satisfy strict requirements regarding accomplishment of high-frequency characteristics of semiconductor IC devices. In the prior art, since no consideration is given as to how the pad layout conversion carrier substrate is arranged in structure, the package leads will possibly include those being increased in length causing inductance thereat to increase accordingly.

Still another disadvantage is that where the soldering pads are further increased in number in the near future, it will possibly happen that all of such pads can no longer be successfully wire-bonded for electrical connection due to the insufficiency of wiring density in double-surface wiring substrates. If this were the case, multiple layer structure will be required for the carrier substrate. However, use of such multilayer structure can result in an increase in production cost while increasing complexity. In light of the above, it can hardly be said that the prior art BGA packaging is suitable for high pin count applications.

SUMMARY OF THE INVENTION

It is therefore an object of the present invention to provide an improved method and structure of pad array carrier packaging for use in semiconductor devices.

It is another object of the invention to provide an improved packaging scheme and electrode structure of a semiconductor integrated circuit device for layout conversion of an array of bonding pads on the periphery of an IC chip to a grid array of terminal solder pads spanning substantially the entire surface of the chip while attaining a minimized wire-lead distance or pitch and reducing manufacturing costs therefor.

To attain the foregoing objects the present invention provides an electrode structure for use in a semiconductor integrated circuit device including a semiconductor element with a plurality of peripheral electrode pads on the periphery thereof for external connection, and a wiring substrate for conversion of pad array layout, wherein the wiring substrate permits rearrangement of the peripheral electrode pads into an area array of rows and columns of terminal pads while causing the area array to be several times greater in pitch than the peripheral pads of the semiconductor element.

In accordance with another aspect of the invention, an electrode structure of a semiconductor integrated circuit device is provided which includes a semiconductor element, and a plurality of external connection electrode pads on the periphery of the semiconductor element, wherein the external connection pads define a number of pads per side as given by a function of $2i(2i-1)$ where "i" is an integer, and wherein the semiconductor element includes a square flat chip with four sides of equal length on which the external connection pads are disposed at equal intervals therebetween while allowing an identical number of pads to be arrayed along a respective one of the four sides of the chip.

The present invention also provides a method of fabricating a package for a semiconductor integrated circuit device having the steps of: forming by electroless plating techniques a coat layer made of a lamination of nickel and gold and overlying a substrate—a wafer, or a chip—with a plurality of external connection pads made of aluminum on the periphery of a semiconductor element thereon; electrically connecting by metal contacts by thermo-compressive bonding peripheral electrode pads relating to the external connection pads and a wiring substrate for conversion of pad layout which permits rearrangement of the peripheral bonding pads into an area array of rows and columns of terminal solder pads; and filling a chosen adhesive resin material in a gap between the wiring substrate and the semiconductor element as mounted thereto.

In accordance with a still another aspect of the invention, there is provided a method of forming a package for a semiconductor integrated circuit device with the aforesaid electrode structure, wherein a substrate with a plurality of external connection pads made of aluminum on the periphery of a semiconductor element is electrically coupled to a wiring substrate for conversion of pad array layout which permits rearrangement of peripheral pads relating to the external connection pads into an area array of rows and columns of terminal solder pads, by use of an anisotropic conductive film being sandwiched therebetween.

In accordance with a further aspect of the invention, a method of forming a package for a semiconductor integrated circuit device with the prescribed electrode structure is provided which includes the steps of: providing test-use terminal pads on a wiring substrate for conversion of pad array layout at a location outside an area in which a semiconductor element is to be mounted, the wiring substrate permitting rearrangement of peripheral soldering pads of the semiconductor element into a grid array of solder pads on the opposite surface thereof; and cutting away the test terminal pads for removal, after completion of reliability testing of the semiconductor element by use of the test terminal pads, thereby forming a chip-size wiring substrate that is equivalent in chip size to the semiconductor element.

Principally, the objects mentioned above are achieved by use of a semiconductor element (IC chip) having a predefined number of peripheral bonding pads associated with external connection pads with a specific relationship being determined using certain functions therebetween and a wiring substrate (layout conversion substrate) for electrical connection of the peripheral bonding pads to convert the layout of the peripheral bonding pads to a grid array of terminal solder pads on the opposite substrate surface.

More specifically, while the IC chip is of a flat square shape, the bonding pads are provided on one chip surface in such a manner that an equal number (N+1) are arrayed at equal intervals "p" along each side of the chip. These pads are to be connected to the electrode layout conversion substrate. Provided on a corresponding surface of the conversion substrate are "receptacle" electrodes which are arrayed in a layout arrangement that corresponds to that of those pads on the IC chip. A grid array of via holes are also provided in the substrate for electrical interconnection to terminal solder pads on the bottom surface of the substrate such that adjacent vias are at a specifically chosen interval which is several times greater than the interval p of the IC chip, wherein the chosen interval may be given as "ip" where i is an integer.

A positional relation between the outermost ones of the grid array of via holes and a corresponding linear array section of peripheral pads is such that the distance between one outermost via hole and a nearby peripheral pad is equivalent to or less than one pitch of the grid array. Under this condition any via hole is tied to a corresponding one of the peripheral pads by a package lead trace that is minimized in length. Such a layout arrangement results in that the number n of one row or column of via holes extending along one side of the IC chip is equal to N/i+1.

In addition, terminal solder pads for flip-chip (FC) connection are provided on the bottom surface of the conversion substrate, which are connected through the via holes.

This arrangement makes it possible for the peripheral pads of the IC chip and the FC solder pads to be coupled together with the distance being minimized therebetween.

These and other objects, features and advantages of the invention will be apparent from the following more particular description of preferred embodiments of the invention, as illustrated in the accompanying drawings.

DETAILED DESCRIPTION OF THE INVENTION

Figure 1:
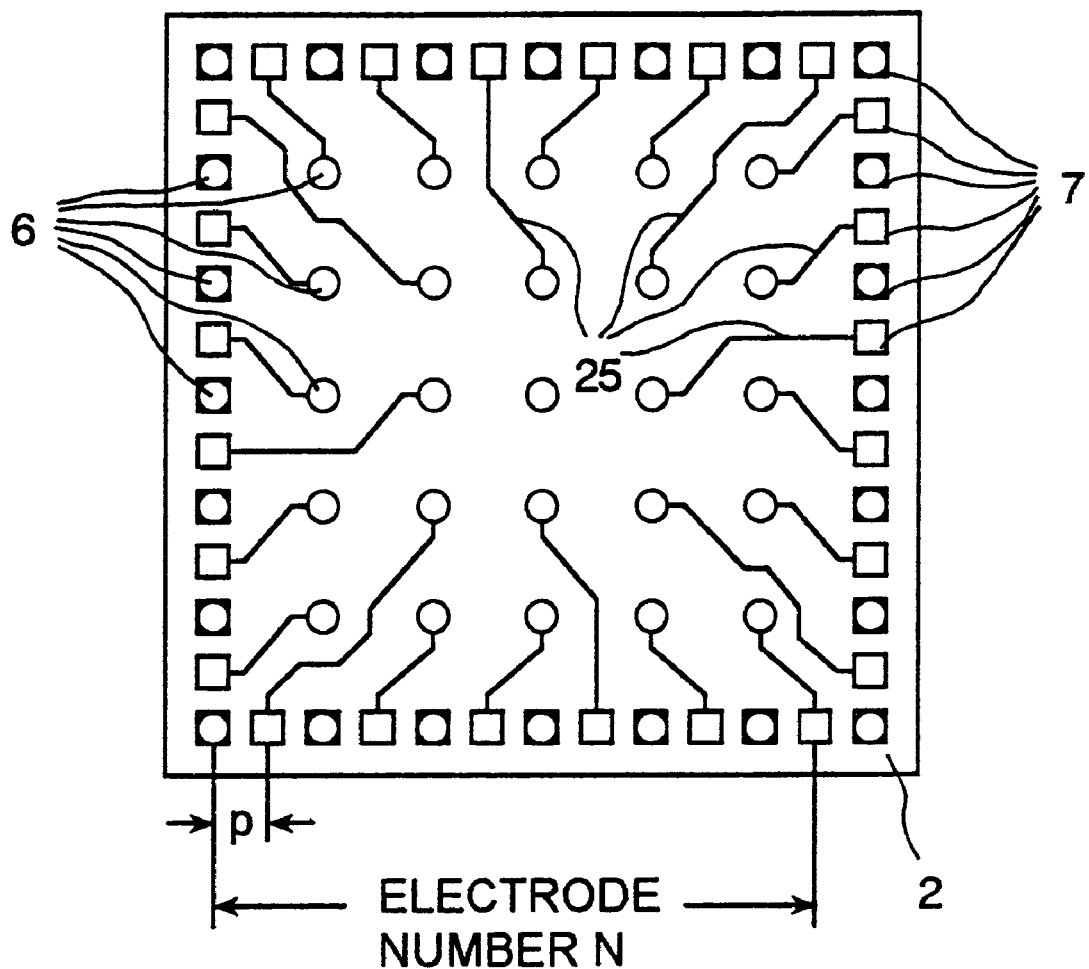
FIG. 1 is a top plan view of a pad layout conversion substrate having a pad array pattern on one surface thereof in accordance with one preferred embodiment of the invention.
Figure 2:
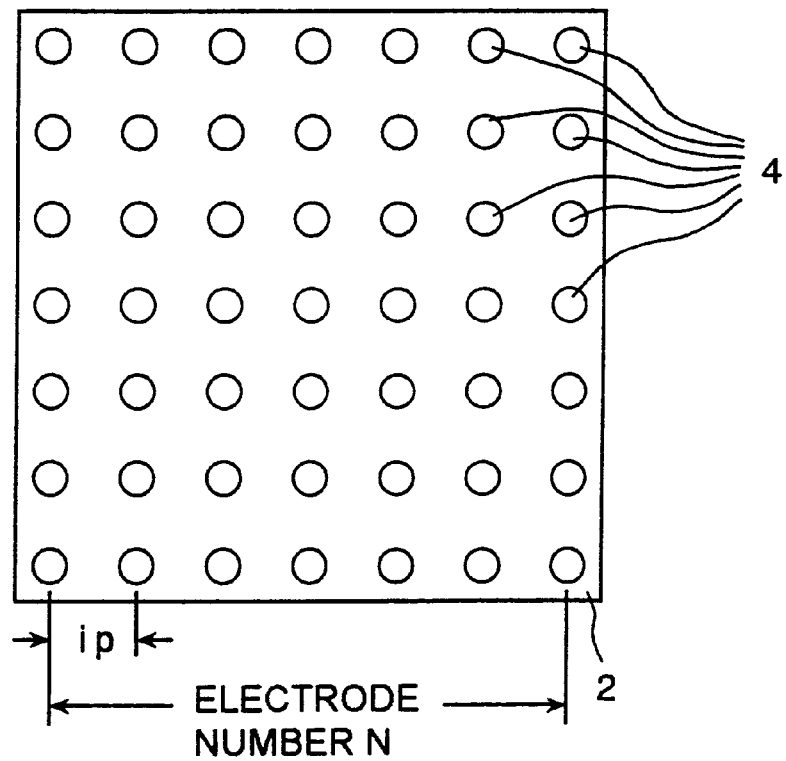
FIG. 2 is a bottom plan view of the substrate shown in FIG. 1.

The principles of the pad array layout arrangement in accordance with the present invention will be fully described with reference to FIGS. 1 and 2. FIG. 1 shows a pad layout pattern on the top surface of a flat square pad-layout conversion substrate 2 and FIG. 2 depicts the same on the bottom surface thereof.

As shown in FIG. 1, a square loop of square islands 7 on the top surface of conversion substrate 2 along the peripheral edges are regularly spaced-apart peripheral bonding pads for interconnection with external connection pads of an IC chip (not shown) to be mounted thereon.

Each bonding pad 7 corresponds in position to one of the bonding pads on the IC chip. A predefined number, N+1, of bonding pads 7 are arrayed at intervals p along each of four sides of the substrate 2. For purposes of explanation, the illustrative configuration assumes N to be twelve (12).

The substrate of FIG. 1 also comes with a grid array of conductive through holes 6 which are depicted by circles for achievement of electrical coupling by package lead traces 25 to the bottom surface of the conversion substrate 2. The holes 6 may be called the "filled via holes" or simply "vias" in the art to which the invention pertains. As shown, these via holes 6 are configured so that the grid array of vias 6 spans to occupy substantially the entire area of the conversion substrate 2 with a pitch equal to the peripheral bonding-pad pitch p multiplied by an integer i. The integer i is assumed to be two (2) for purposes of explanation only.

As shown in FIG. 2, a grid array of flip-chip (FC) connection terminal solder pads 4 which are depicted by circles is provided on the bottom surface of the pad layout conversion substrate 2, which array occupies substantially the entire area of the substrate bottom surface. These FC solder pads 4 may correspond in location to the grid array of via holes 6 as provided on the top surface of the substrate 2 shown in FIG. 1.

The grid pattern consists of a matrix of rows and columns of FC solder pads 4 of equal number n. In other words, while the substrate exhibits square planar shape, one row or column of n number of FC pads 4 are disposed along each of four sides of substrate 2 at an equal distance or pitch between adjacent pads. More specifically, the number N of peripheral bonding pads on each side of an associated IC chip and the number n of the grid array of FC pads 4 on the substrate bottom surface are specifically determined in value to satisfy:

$$N=i(n-1) \quad (1)$$

where i is a given integer.

For coincidence of the number 4N of the peripheral pads 7 and the number $n^2$ of the grid arrayed FC solder pads 4, the following equation should be satisfied:

$$4N=n^2-1 \quad (2)$$

To connect all of the pads concerned, it is required that both Eq. (1) and Eq. (2) be satisfied simultaneously. To do this, the electrode numbers concerned may be given as:

$$N=2i(2i-1) \quad (3)$$

$$n=4i-1 \quad (4)$$

Note that this is true for any examples where n is an odd number; if n is an odd number then one electrode pad at the center of the substrate surface should be excluded because of the fact that such a center pad is incapable of being wired to any one of the peripheral pads 7.

TABLE 1

| multiple number i | electrode number n 4i − 1 | electrode number N 2i(2i − 1) | total electrode 4N |
|---|---|---|---|
| 1 | 3 | 2 | 8 |
| 2 | 7 | 12 | 48 |
| 3 | 11 | 30 | 120 |
| 4 | 15 | 56 | 224 |
| 5 | 19 | 90 | 360 |
| 6 | 23 | 132 | 528 |
| 7 | 27 | 182 | 728 |
| 8 | 31 | 240 | 960 |
| 9 | 35 | 306 | 1224 |
| 10 | 39 | 380 | 1520 |

Table 1 shows several exemplary electrode numbers that meet the conditions as defined by Eqs. (3) and (4).

From the foregoing, it is to be understood that it becomes possible—by use of the pad-array layout conversion substrate 2 with a specifically chosen number of pads in accordance with the teachings of Table 1 being tied by package leads 25 to satisfy the wiring rule as discussed in connection with FIG. 1—to obtain a ball grid array (BGA) package which is equal to or less in size than an associative IC chip while permitting minimum-distance interconnection between corresponding pads concerned.

One primary advantage of the present invention is that a respective one of peripheral bonding pads 7 can be tied by package leads 25 through via holes 6 to a corresponding one of the FC solder pads 4 on the opposite surface of conversion substrate 2 at a minimal distance therebetween. This can be said because as shown in FIG. 1 every i-th (i-alternate) ones of the N peripheral pads 7 is coupled by one corresponding lead 25 through one via hole 6 to a "destination" FC solder pad 4 on the bottom surface of the conversion substrate 2, a corresponding number—namely, 1/i—of FC pads 4 can be allowed to be located at the positions just below the remaining ones of the i-alternate peripheral bonding pads 7, which in turn eliminates use of any extra lead wires therefor. This may also enable the FC solder pads 4 to be i times greater in layout pitch than the peripheral bonding pads 7 of substrate 2.

Here, by specifically choosing the pad number so that it satisfies both Eq. (1) and Eq. (2) at a time, it becomes possible to efficiently make use of the entire area of the layout conversion substrate 2 while reducing the size of it.

Furthermore, it makes possible to render uniform or equalize the required number of package leads 25 extending through the via holes 6 in cases where they extend from the periphery of the substrate 2 toward the center thereof, which in turn enables a reduction in the number of wiring layers to be employed therein.

Several preferred embodiments of the invention will be further described with reference to FIGS. 3 through 7.

First, one typical example of the electrode structure of a semiconductor IC device will be explained in connection with FIGS. 3 and 4.

Figure 3:
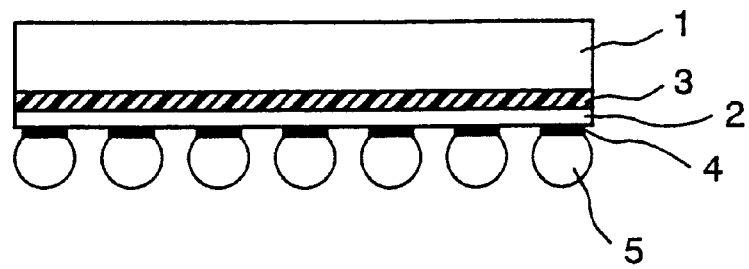
FIG. 3 is a side view of a chip-size package in accordance with another embodiment of the invention.

FIG. 3 illustrates a side view of a chip-size IC package in accordance with another embodiment of the invention, while an enlarged partial cross-section thereof is depicted in FIG. 3.

Referring to FIG. 3, reference numeral 1 designates an IC chip employed as the semiconductor element, which has a mount surface at its bottom that is mounted onto a wiring conversion substrate 2 with an adhesion resin layer 3 filled and sandwiched therebetween. The substrate 2 is provided for permitting conversion of the layout of bonding pads of the IC chip 1. The wiring conversion (pad-array layout conversion) substrate 2 has an opposite surface having a grid array of rows and columns, or matrix, of a predefined number of terminal solder pads 4 for FC connection, each of which has ball-like solder bumps or "solder balls" 5 as formed thereon.

Figure 4:
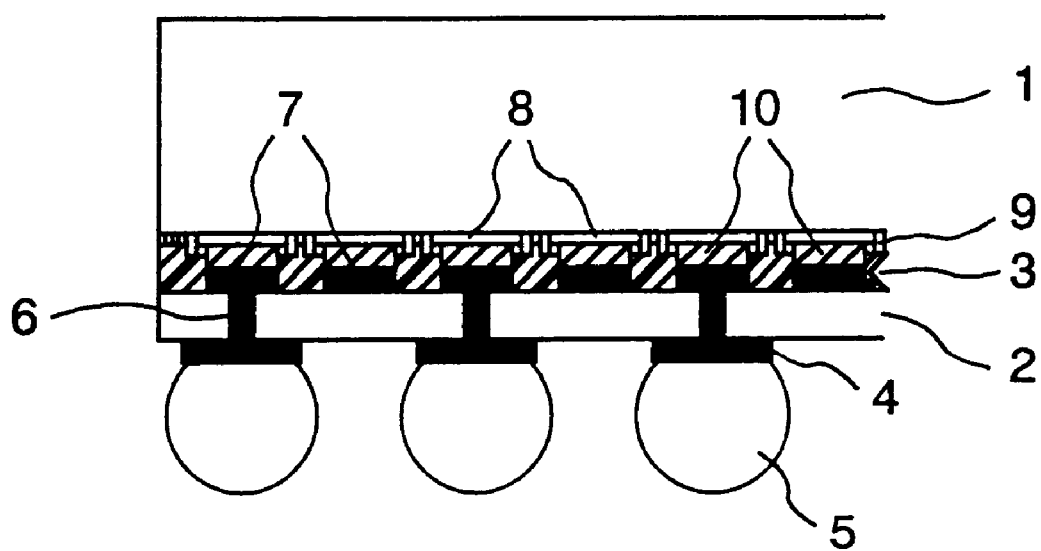
FIG. 4 is an enlarged partial cross-sectional view of the package of FIG. 3.

As can be seen in more detail from FIG. 4, the wiring conversion substrate 2 is provided with several filled via holes 6, which are identical in number to the solder balls 5. At each via hole 6 the wiring conversion substrate 3 has on one surface (top, chip-mount surface) a peripheral bonding pad 7 which acts as an external connection electrode as arrayed on the periphery of the IC chip 1. A metal wiring layer 8 made of aluminum is formed on the bottom or adhesion surface of IC chip 1 to provide a predefined pattern of package lead traces 8 thereon. Each of the package leads 8 is covered with a passivation layer 9 serving as a protective film for electrical isolation between adjacent ones of leads 8 on the IC chip surface. Each lead 8 is electrically coupled to a corresponding one of interconnections 10, which is made of a chosen metal.

The IC package shown in FIG. 3 is the one which is fabricated by mounting the IC chip 1 to the pad layout conversion substrate 2, filling the adhesive resin 3 in a gap space as defined between the IC chip 1 and layout conversion substrate 2, and thereafter forming solder balls 5 on respective FC solder pads 4 on the bottom surface of substrate 2, thereby to attain an intended chip-size package structure.

As shown in FIG. 4, the aluminum package leads 8 reside at a periphery of IC chip 1 while the protective film 9 has openings at certain locations that correspond to contact sections of leads 8 to allow each interconnection metal 10 to be put thereon for providing electrical interconnection to a corresponding one of the peripheral bonding pads 7.

A relation of the IC chip 1 and pad layout conversion substrate 2 is as follows. The peripheral bonding pads on IC chip 1 are electrically coupled to the peripheral bonding pads 7 on conversion substrate 2 while offering a one-to-one correspondence therebetween in such a manner that alternate ones of peripheral pads 7 are connected to corresponding ones of FC solder pads 4 on the substrate bottom surface by way of filled vias 6 associated therewith.

Though not specifically illustrated in FIG. 4, the remaining ones of the peripheral bonding pads on the substrate 2 other than the aforesaid ones being coupled to the underlying FC solder pads 4 are to be tied by package leads 25 to the grid array of vias 6 centrally provided on the top surface of layout conversion substrate 2 as shown in FIG. 1, which vias are in turn connected to associative FC solder pads 4 on the bottom surface of substrate 2 while solder balls 5 are similarly formed thereon respectively.

In the illustrative embodiments are each an IC package structure that assumes i=2; that is, the FC solder pads 4 employed are twice the peripheral bonding pads 7 in interval or layout pitch. More specifically, where the layout pitch of peripheral pads 7 is 0.15 mm, the pitch of FC pads 4 measures 0.3 mm. This may advantageously serve to suppress occurrence of a failure based on electrical shortcircuit damages due to irregularity of solder balls 5.

Typically, most currently available IC chips employ a protective film for coverage of the surface of aluminum package lead traces, part of which film is removed away to define a "window" in order to attain an electrode structure for wire-bonding required, as known under the name of wire-bonding (WB) pads. The illustrative embodiment also follows this scheme. However, in this case, such aluminum interconnections 8 must be rather inadequate for applications to metal-to-metal contacts that strictly require wetness for soldering and/or thermal compression bonding techniques due to the fact that such aluminum electrodes can be easily oxidized to form an oxide film covering the surface thereof. This can be true for the present embodiment also.

Conventionally, to avoid this problem, a fabrication of bonding pads has been done in such a way that, for FC solder pads, a hybrid film consisting of chromium (Cr), copper (Co) and aluminum (Al) layers laminated is preformed by sputtering techniques on each aluminum base pad before a wafer is cut away into chips, and that pads are then formed on the wafer by photolithographically masking and etching the laminated layers.

Unfortunately, this approach still suffers from problems: fabrication is limited in applicability to wafers only; and, the process is increased in complexity thereby increasing manufacturing costs. One approach proposed to overcome this is to form bonding pads by performing electroless plating of nickel (Ni) and gold (Au) on the aluminum bases.

With this fabrication method, after the aluminum base pads are cleaned up using dilute sulfuric acid solution, palladium (Pd)-activation treatment is carried out; subsequently, nickel-phosphorus (Ni-P)/gold (Au) electroless plating is then performed.

With the latter method, since the Ni-P/Au metal film is grown exclusively on the aluminum base pads, any special extra patterning process is no longer required while eliminating use of high-cost sputtering equipment, thus enabling successful fabrication or manufacture of low-cost metal interconnections 10 for the IC chip 1. Further, eliminating execution of the photolithography process leads to the possibility of forming intended pads even for IC chips that have been cut away from a wafer.

A method of fabricating the pad layout conversion substrate 2 will now be described with reference to FIGS. 5A to 5H.

FIGS. 5A–5H illustrate in cross-section major steps in the manufacture of a film circuit substrate in accordance with a further embodiment of the invention.

Figure 5A:
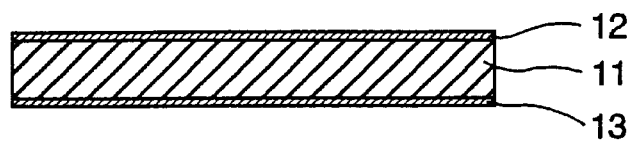
FIGS. 5A through 5H illustrate in cross-section major steps of fabrication of a film circuit carrier body in accordance with a further embodiment of the invention.
Figure 5B:
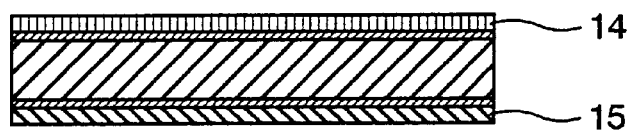

As shown in FIG. 5A, a double copper faced sheet is prepared with two copper films on the opposite surfaces thereof. This sheet consists of a polyimide sheet 11, a first copper thin film 12 on the top surface of sheet 11, and a second copper thin film 13 on the bottom surface. At step of FIG. 5B a resist film 14 is formed on the first copper film 12 while a protective film 15 is on the second film 13.

Figure 5C:
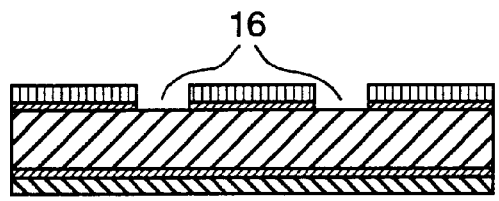

As shown in FIG. 5C, the resist film 14 is subject to known exposure and development treatments; then, with the resultant patterned resist film being used as a mask, the underlying copper film 12 is partly etched away providing therein several openings 16 which may define locations of vias to be formed later.

Figure 5D:

As shown in FIG. 5D, the resulting structure is next subject to a laser-patterning process with the patterned copper film 12 as a mask therefor so that the sheet 11 is patterned forming therein via holes 17 which are identical in planar shape to the openings 16 in its overlying mask pattern 14.

Figure 5E:

Then, as shown in FIG. 5E, electrometalization is performed causing the via holes 17 to be filled with a copper metal, thereby to form in sheet 11 metal-filled through-going holes 18 which may act as vias 6 of FIG. 4.

Figure 5F:
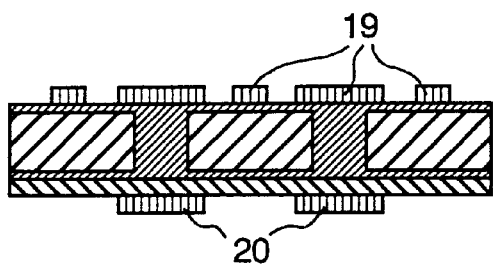

At the step of FIG. 5F, after the resist film 14 that is left in the previous step and the protective film 15 are removed away, resist films 19, 20 are then deposited on resultant top and bottom surfaces of the structure respectively. These films 19, 20 are patterned by known exposure and development techniques to form a resist pattern 19 on the top surface of the structure as well as a resist pattern 20 on the bottom surface thereof.

Figure 5G:
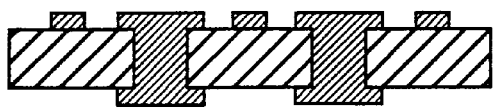

At the step of FIG. 5G etching is performed with each patterned resist film 19, 20 being uesd as a mask therefor, causing the top and bottom copper films 12, 13 to be partly etched away. After removal of resist films 19, 20, the polyimide sheet 11 has on its top and bottom surfaces connection pads and package leads of copper that are configured to define an intended circuit pattern as shown.

Figure 5H:
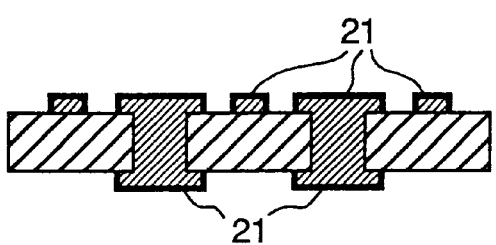

Next, as shown in FIG. 5H, resultant pads and leads are subject to an electroless plating process so that metal coat films 21 are formed to exclusively cover the exposed surfaces of them. The metal used here may be tin (Sn). In this way, the pad layout conversion substrate is completed successfully.

See FIGS. 6A to 6E, which depict in cross-section some major steps in the manufacture of a chip-size package structure in accordance with a further embodiment of the invention, which package may be formed by mounting an IC chip to the pad layout conversion substrate and then providing electrical interconnections therebetween.

Figure 6A:
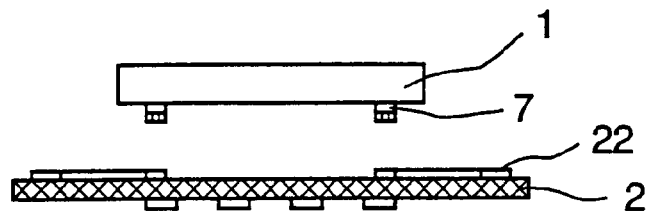
FIGS. 6A to 6E depict in cross-section major steps of assembly of a chip-size package in accordance with a still further embodiment of the invention.

As shown in FIG. 6A, an IC chip has peripheral bonding pads 7 on its mount surface, whereas a pad layout conversion substrate 2—this may be prepared separately from IC chip 1 by use of the method as discussed previously in connection with FIGS. 5A to 5H—has on its bottom surface FC solder pads 4 at specified locations. Note here that conversion substrate 2 is greater in size than IC chip 1 allowing reliability test-terminal electrodes 22 to be provided at certain positions in the peripheral or "marginal" surface area of substrate 2 outside the IC chip 1 when mounted thereon.

Figure 6B:
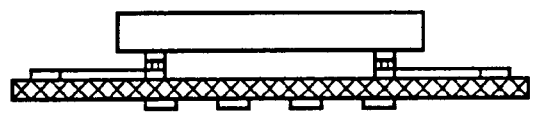

At the step of FIG. 6B the IC chip 1 is centrally mounted on the conversion substrate 2 with peripheral bonding pads 7 being contacted and bonded by thermal adhesion techniques to those of substrate 2 which are at corresponding positions on the top surface of substrate 2. In this embodiment the connection pads of IC chip 1 may be comprised of a plating-metalized film of an Ni-Au lamination whereas those pads of substrate 2 may be a Sn plating-metalized film. With the use of such combination of these materials, the IC chip 1 is pressed against substrate 2 upon application of a chosen pressure of 20 kilograms per square centimeter (kg/cm2) or therearound at temperatures of more than 217° C., which is the eutectic temperature of Au-Sn alloy. This may enable the IC-chip peripheral pads to be electrically coupled to corresponding ones of substrate 2 by creation of Au-Sn diffusion contacts therebetween.

Figure 6C:

The structure of FIG. 6C is then subject to on-chip circuit test procedure by use of the test terminal pads 22 on the periphery of conversion substrate 2 in order to check for function-suitability and reliability of the IC chip 1 for future use. If the IC chip 1 has passed the test successfully then a chosen hardenable reinforcing material 23 which may be epoxy resin is filled between IC chip 1 and its underlying conversion substrate 2, to thereby attain mechanical reinforcement for any contact sections between them, as shown in FIG. 6C.

Figure 6D:
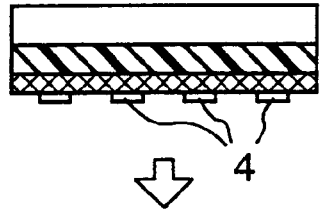

The step of FIG. 6D the central section of the conversion substrate 2 on which the IC chip 1 is fixedly mounted is cut away from the remaining, peripheral portion thereof.

Figure 6E:
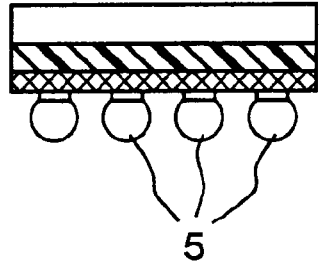

Thereafter, as shown in FIG. 6E, the resultant structure of IC chip 1 and partly cutaway substrate 2 with reinforcement resin 23 sandwiched therebetween is subject to a solder-ball formation process. This process may include the steps of forming solder balls on respective FC solder pads 4 on the bottom surface of substrate 2, and reflowing (melting) these balls so that solder bumps 5 of equal size are formed on FC pads 4 as shown. Thus, an intended chip-size package (CSP) structure has been completed.

In the illustrative embodiment the Au-Sn diffusion contact scheme is employed for electrical connection between the IC chip 1 and pad layout conversion substrate 2. The present invention should not be exclusively limited to this arrangement; alternatively, these may be bonded together by use of an anisotropic conductive film (ACF) which is comprised of an adhesive resin material with chosen metal particles or micro-compounds as mixed therein.

Figure 7:
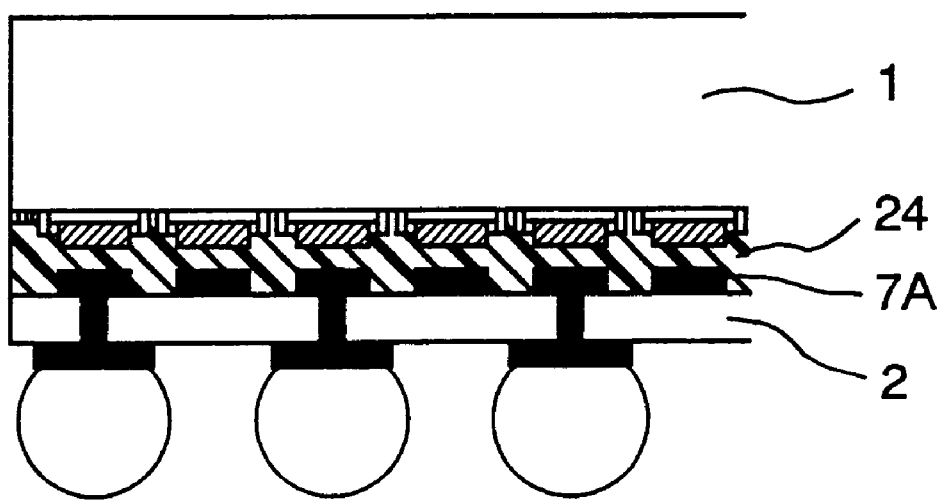
FIG. 7 is an enlarged partial cross-sectional view of a chip-size package in accordance with a further embodiment of the invention.

Turning now to FIG. 7, there is presented an enlarged partial depiction of a CSP structure using such ACF sheet in accordance with a still further embodiment of the invention.

The CSP structure shown in FIG. 7 is the one which is fabricated and assembled using an anisotropic conductive resin layer 24 laid between the bottom surface of IC chip 1 and the top surface of the underlying conversion substrate 2, the layer 24 being employed as the ACF.

The ACF resin layer 24 which has been cut into a predefined chip size is laminated on and temporarily adhered to the bottom surface of IC chip 1 under the pressure of 10 kg/cm2 at the temperature of 80° C. The resultant chip structure is then subject to final mount-adhesion to the conversion substrate 2, after precise position-alignment is done therebetween, under the pressure of 20 kg/cm2 at a temperature of 180° C.

With the two-step adhesion scheme using ACF resin layer 24, the IC chip 1 and conversion substrate 2 are electrically interconnected to each other at their corresponding opposed bonding pads while successfully allowing any portions other than these pads to be electrically isolated and firmly bonded together by ACF resin 24 laid between IC chip 1 and substrate 2. This may advantageously serve to eliminate the need to fill an additional resin after completion of the electrode bonding process as performed in the previous embodiment with Au-Sn diffusion-bonded pads.

It should be noted that in this scheme, while in the illustrative embodiments Sn-plating is employed at the step shown in FIG. 5H, the use of Au-plating would be more preferable if circumstance permits when the invention is reduced to practice. This can be said because Au-plated layers remain stable in connection resistance when used as the bonding pads of the layout conversion substrate 2.

One significant advantage of the present invention is that the layout pitch between adjacent ones of package wire-bonding pads can be increased, reducing the risk of occurrence of undesired electrical shortcircuiting between them due to the fact that the use of a pad layout conversion substrate identical in size to an associated IC chip being mounted thereon permits achievement of successful conversion of "original" bonding pads at the periphery of the IC chip to a grid array of terminal solder pads.

Another advantage of the invention is that the number of wire leads expected to extend through conductive through-holes or vias can be made uniform, reducing the wire-lead intervals, which in turn leads to a decrease in number of wiring layers required therein, as originated from the fact that predefined conditions are given to the relationship between the number of bonding pads on the periphery of an IC chip and the grid array of terminal solder pads on the bottom of a conversion substrate with interconnection routing being minimized in length.

A further advantage is that the problems relating to quality guarantee of ICs conventionally occurring with use of bare-chips can be avoided. This is because the test terminal pads are specifically provided on the outer periphery of the layout conversion substrate, enabling execution of a reliability test procedure on semiconductor devices before shipping out thereof.

A still further advantage is that performing Ni-Au plating on the exposed entire surface of aluminum base pads on an IC chip serves to permit use of currently available thermal compression bonding techniques for interconnection as well as employment of low-cost connection techniques using ACFs, enabling manufacturing cost to be decreased as a whole.

As has been apparent from the foregoing, in accordance with the present invention, there can be provided an improved packaging scheme and electrode structure of a semiconductor IC device for layout conversion of internal bonding pads on the periphery of an IC chip to a grid array of terminal solder pads spanning substantially the entire surface of the chip while attaining a minimized wire-lead pitch or distance and also reducing manufacturing costs.

While the invention has been particularly shown and described with reference to preferred embodiments thereof, it will be understood by those skilled in the art that the foregoing and other changes in form and details may be made therein without departing from the spirit and scope of the invention.

I claim:

1. A semiconductor device comprising:
    an integrated circuit chip having a plurality of first electrodes disposed on the peripheral portion thereof; and
    a wiring portion having a plurality of second electrodes disposed on the peripheral portion of a first face of the wiring portion, and a plurality of third electrodes disposed on a second face of said wiring portion, said second electrodes being electrically connected to said third electrodes, the number N of said first electrodes and the number n of said third electrodes being provided to satisfy $N=i(n-1)$, where i is an integer.

2. A semiconductor device according to claim 1, wherein the number N of said first electrodes and the number n of said third electrodes satisfy $4N=n^2-1$.

3. A semiconductor device according to claim 1, wherein the number N of said first electrodes and the number n of said third electrodes satisfy $N=2i(2i-1)$ and $n=4i-1$.

4. A semiconductor device according to claim 1, wherein said third electrodes are disposed in an array.

5. A semiconductor device according to claim 1, wherein the plurality of first electrodes are disposed on a major surface of said integrated circuit chip, and the surface area of said integrated circuit chip major surface is substantially equal to the surface area of said second face of said wiring portion.

6. A semiconductor device according to claim 2, wherein the number N of said first electrodes and the number n of said third electrodes satisfy $N=2i(2i-1)$ and $n=4i-1$.

7. A semiconductor device according to claim 2, wherein said third electrodes are disposed in an array.

8. A semiconductor device according to claim 2, wherein the number N of said first electrodes and the number n of said third electrodes satisfy $N=2i(2i-1)$ and $n=4i-1$, and wherein said third electrodes are disposed in an array.

9. A semiconductor device according to claim 2, wherein the plurality of first electrodes are disposed on a major surface of said integrated circuit chip, and the surface area of said integrated circuit chip major surface is substantially equal to the surface area of said second face of said wiring portion.

10. A semiconductor device according to claim 2, wherein the number N of said first electrodes and the number n of said third electrodes satisfy $N=2i(2i-1)$ and $n=4i-1$, and wherein the plurality of first electrodes are disposed on a major surface of said integrated circuit chip, and the surface area of said integrated circuit chip major surface is substantially equal to the surface area of said second face of said wiring portion.

11. A semiconductor device according to claim 2, wherein said third electrodes are disposed in an array, and wherein the plurality of first electrodes are disposed on a major surface of said integrated circuit chip, and the surface area of said integrated circuit chip major surface is substantially equal to the surface area of said second face of said wiring portion.

12. A semiconductor device according to claim 2, wherein the number N of said first electrodes and the number n of said third electrodes satisfy $N=2i(2i-1)$ and $n=4i-1$, wherein said third electrodes are disposed in an array, and wherein the plurality of first electrodes are disposed on a major surface of said integrated circuit chip, and the surface area of said integrated circuit chip major surface is substantially equal to the surface area of said second face of said wiring portion.

13. A semiconductor device according to claim 3, wherein said third electrodes are disposed in an array.

14. A semiconductor device according to claim 3, wherein the plurality of first electrodes are disposed on a major surface of said integrated circuit chip, and the surface area of said integrated circuit chip major surface is substantially equal to the surface area of said second face of said wiring portion.

15. A semiconductor device according to claim 3, wherein said third electrodes are disposed in an array, and wherein the plurality of first electrodes are disposed on a major surface of said integrated circuit chip, and the surface area of said integrated circuit chip major surface is substantially equal to the surface area of said second face of said wiring portion.

16. A semiconductor device according to claim 4, wherein the plurality of first electrodes are disposed on a major surface of said integrated circuit chip, and the surface area of said integrated circuit chip major surface is substantially equal to the surface area of said second face of said wiring portion.

* * * * *